United States Patent [19]
Holland

[11] 4,200,349
[45] Apr. 29, 1980

[54] LOW FORCE PRINTED CIRCUIT BOARD CONNECTOR APPARATUS

[75] Inventor: Richard W. Holland, Los Gatos, Calif.

[73] Assignee: Fairchild Camera and Instrument Corporation, Mountain View, Calif.

[21] Appl. No.: 2,285

[22] Filed: Jan. 10, 1979

[51] Int. Cl.[2] .................. H05K 1/07
[52] U.S. Cl. .................. 339/75 MP; 339/176 MP
[58] Field of Search .................. 339/17 L, 75 R, 75 M, 339/75 MP, 176 MP, 273 R

[56] References Cited

U.S. PATENT DOCUMENTS

| | | | |
|---|---|---|---|
| 2,711,523 | 6/1955 | Willis | 339/75 MP |
| 2,811,700 | 10/1957 | Kuch | 339/273 R |
| 3,188,598 | 6/1965 | Pferd | 339/75 MP |
| 3,789,345 | 1/1974 | Reimer et aal. | 339/75 MP |
| 4,084,874 | 4/1978 | Georgopulos | 339/75 MP |
| 4,095,791 | 6/1978 | Smith et al. | 273/85 G |

FOREIGN PATENT DOCUMENTS

| | | | |
|---|---|---|---|
| 189508 | 5/1964 | Sweden | 339/273 R |
| 184297 | 7/1966 | U.S.S.R. | 339/17 L |

*Primary Examiner*—Neil Abrams
*Attorney, Agent, or Firm*—Alan H. MacPherson; Paul J. Winters; Robert C. Colwell

[57] ABSTRACT

Connector apparatus for making contact with a printed circuit board includes a pair of resilient spring contact members which are brought into contact with opposite sides of a printed circuit board by, in one embodiment, rotation of the printed circuit board generally about an axis parallel to the inserted edge thereof, and in another embodiment, by the edge of the printed circuit board being brought into contact with and moving a body having rollers mounted thereto which contact the resilient spring contact members to force them against the opposite sides of the printed circuit board.

3 Claims, 4 Drawing Figures

LOW FORCE PRINTED CIRCUIT BOARD CONNECTOR APPARATUS

BACKGROUND OF THE INVENTION

This invention relates to connector apparatus for a printed circuit board.

It will be readily understood that in providing apparatus for making connection with a printed circuit board, certain features are desirable. For example, a relatively low force should be needed to insert the edge of the printed circuit board into the connector apparatus to provide electrical connection therewith, but with it further being insured that proper, efficient electrical connection therebetween does indeed take place. Furthermore, the connector apparatus should be simple in design and manufacture, and should be capable of providing many connections to and disconnections from the printed circuit board, meanwhile maintaining a high state of efficiency of operation.

SUMMARY OF THE INVENTION

It is accordingly an object of this invention to provide apparatus for providing electrical connection to a printed circuit board which is capable of providing such connection efficiently over many repeated connections to and disconnections from the printed circuit board, with only low force being necessarily applied to the printed circuit board to provide such connection therewith.

It is a further object of this invention to provide apparatus which, while fulfilling the above object, is extremely simple in design and manufacture.

Broadly stated, in one embodiment of the invention, the invention comprises a connector for a printed circuit board comprising a base, a resilient contact member secured to the base, and an extending member secured to the base, the connecting member and extending member being positioned with respect to the base such that a printed circuit board edge may be disposed therebetween, a so-positioned printed circuit board being rotatable generally about an axis parallel to the inserted edge thereof so that one surface of a printed circuit board contacts the contact member, and the other, opposite surface contacts the extending member.

Broadly stated, the invention also comprises a method of providing contact between a printed circuit board and a pair of resilient contact members comprising inserting a printed circuit board edge between the contact members, and rotating the printed circuit board generally about an axis parallel to the inserted printed circuit board edge, to force the opposite surfaces of the printed circuit board into contact with the pair of contact members.

Broadly state, the invention also comprises a connector for a printed circuit board comprising a base, a first resilient contact member secured to and extending from the base, and a second resilient contact member secured to and extending from the base, and spaced from the first resilient contact member. The invention further comprises a body, and means operatively connected with the body and the contact members for providing that, as a printed circuit board edge is inserted between the contact members to contact and move the body, the resilient contact members are urged and moved against the resilience thereof to bring portions thereof into contact with the respective opposite sides of the printed circuit board.

BRIEF DESCRIPTION OF THE DRAWINGS

Other objects of the invention will become apparent from a study of the following specification and drawings, in which.

DESCRIPTION OF THE PREFERRED EMBODIMENTS

Figure 1:
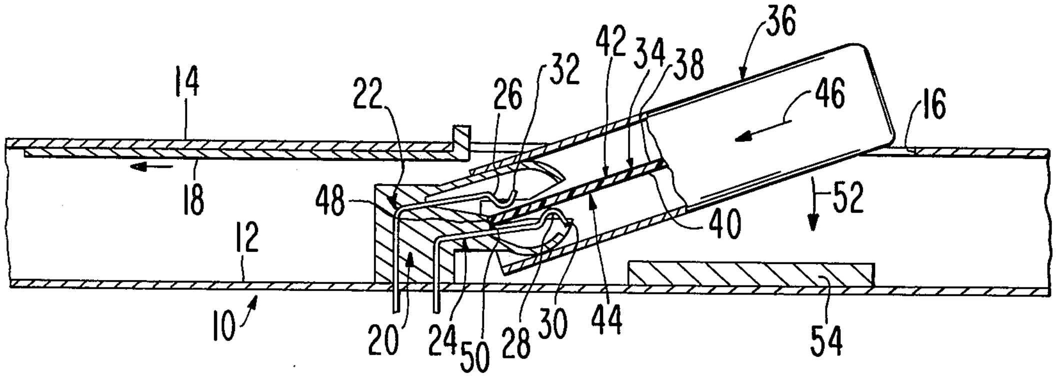
FIGS. 1 and 2 are sectional views showing a first embodiment of the invention, wherein a printed circuit board is brought into engagement with the connector apparatus thereof.
Figure 2:
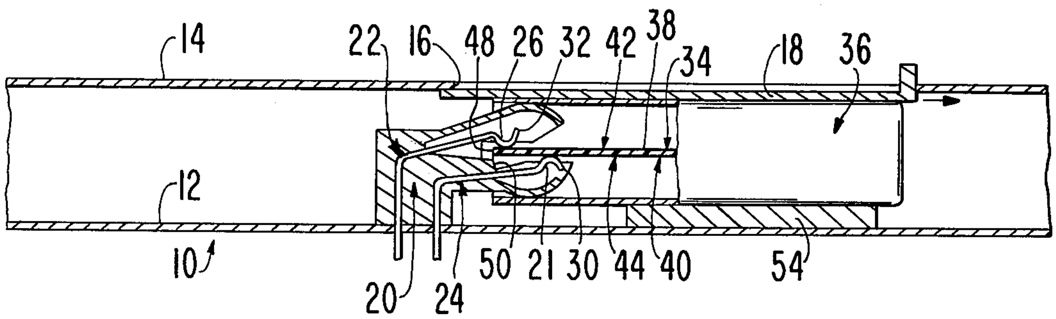

Shown in FIGS. 1 and 2 is a first embodiment of the invention. As shown therein, a console 10 includes a floor 12, and a top 14 defining an opening 16 therethrough which may be covered and uncovered by a sliding door 18. Mounted within the console 10 is a base 20, having a first resilient spring contact member 22 passing therethrough and extending therefrom, and a second resilient spring contact member 24 passing therethrough and extending therefrom, the respective contact members 22, 24 being secured to the base 20. The contact members 22, 24 define respective contact portions 26, 28 which are curved in configuration, with the extended end 30 of the contact member 24 extending somewhat beyond the extended end 32 of the contact member 22 in relation to the base 20.

A printed circuit board 34 is mounted within a cartridge 36, and includes printed circuits 38, 40 as part of the respective upper and lower surfaces 42, 44 thereof. Initially, with the door 18 in an open position as shown in FIG. 1, the cartridge 36 is positioned as shown in such Figure, being moved in the direction as shown by the arrow 46, so that the edge 48 of the printed circuit board 34 is disposed between the contact members 22, 24, actually being disposed between the respective curved contact portions 26, 28 thereof. The cartridge 36 is moved in the direction as shown by the arrow 46 until the actual edge 48 of the printed circuit board 34 contacts a nose surface 50 defined by the base 20, signalling the inserter of the cartridge 36 that the cartridge 36 may then be moved in the direction as indicated by the arrow 52, to within the console 10. This movement causes the printed circuit board 34 to be rotated generally about an axis parallel to the inserted edge 48 thereof, so that the opposite, upper and lower surfaces 43, 44 of the printed circuit board 34 contact the curved contact portions 26, 28 of the contact members 22, 24.

The cartridge 36 is then further moved in the direction as indicated by the arrow 52, until it contacts a pad 54 secured to the floor 12 of the console 10. This further movement causes the so-positioned circuit board 34 to be further rotated generally about an axis parallel to the inserted edge 48 thereof, so that the contact members 22, 24 are moved against their resilience. This insures that proper electrical connection is provided between the contact member 22 and the upper surface 42 of the printed circuit board 34, and the contact member 24 and the lower surface 44 of the printed circuit board 34.

Subsequent to the positioning of the cartridge 36 as shown in FIG. 2, the door 18 may be slid closed to the position shown therein to retain the cartridge 36 in that position.

Removal of the cartridge 36 is undertaken by a reversal of these steps.

It will be seen that the force required to insert the printed circuit board 34 and to make contact with the contact members 22, 24 is extremely low, yet it is insured that highly effective connection therebetween takes place. It should also readily be seen that the connector apparatus is extremely simple in design and manufacture.

Figure 3:
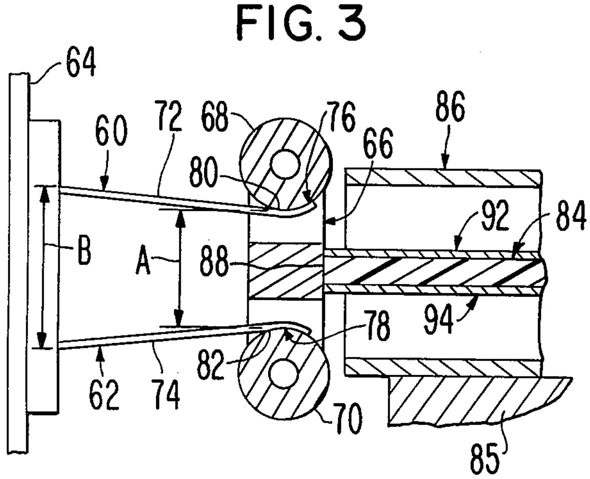
FIGS. 3 and 4 are sectional views of a second embodiment of the invention, showing a printed circuit board being brought into engagement with the connector apparatus thereof.
Figure 4:
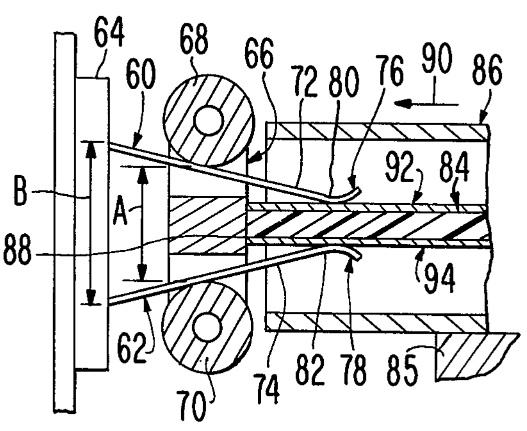

Shown in FIGS. 3 and 4 is another embodiment of the invention. As shown therein, first and second resilient spring contact members 60, 62 are secured to and extend from a base 64. These contact members 60, 62 are spaced apart as shown. A body 66 operatively associated with the contact members 60, 62 has first and second rollers 68, 70 rotatably mounted thereto, the contact members 60, 62 actually extending between the first and second rollers 68, 70. The roller 68 is in rolling contact with the surface 72 of the contact member 60, and the roller 70 is in rolling contact with the surface 74 of the contact member 62. The contact members 60, 62 define respective curved portions 76, 78 in turn defining respective seats 80, 82 in which the first and second rollers 68, 70 seat, respectively, with no connection being made to a printed circuit board. The resilience of the contact spring members 60, 62 is such that the contact members 60, 62 are urged relatively apart, and a certain force is required to move them relatively together. Thus, in a rest state, the rollers 68, 70 will normally be seated in the seats 80, 82, and the body 66 will be positioned as shown in FIG. 3.

If it is desired to insert a printed circuit board 84 mounted in a cartridge 86, the cartridge 86 is moved to the position shown in FIG. 3, on pad 85, bringing the edge 88 of the printed circuit board 84 into contact with the body 66. The cartridge 86 is moved so that the printed circuit board edge 88 is inserted between the contact members 60, 62 to contact and move the body 66. Movement of the printed circuit board 84 leftward, as shown in FIG. 4, in accordance with arrow 90, further causes the printed circuit board edge 88 to be inserted between the contact, members 60, 62, also, of course, moving the body 66 further toward the base 64. It will be seen that with the dimension "B" greater than the dimension "A", the rollers 68, 70, rolling along the surfaces 72, 74, cause the curved portions 76, 78 to be brought into contact with the respective opposite sides 92, 94 of the printed circuit board 84, so that electrical connection is made between the contact member 60 and surface 92, and between the contact member 62 and surface 94, as the cartridge 86 is slid along the pad 85 in the direction indicated by the arrow 90.

It will readily be appreciated that means may be provided to retain the cartridge 86 and printed circuit board 84 in the position as shown in FIG. 4 as selected, such that the cartridge 86 and printed circuit board 84 may later be moved rightwardly (FIG. 4) and removed from the connector apparatus, to allow the body 66 and rollers 68, 70, along with the contact members 60, 62, to adopt the positions shown in FIG. 3.

It again will be readily seen that the connector apparatus of the embodiment of FIGS. 3 and 4 is highly efficient in operation, requiring very low force to be applied for insertion of the printed circuit board 84. It will also be seen that the present embodiment is extremely simple in design and effective in use.

What is claimed is:

1. A connector apparatus for a printed circuit board comprising: a base; a first resilient contact member secured to and extending from said base: a second resilient contact member secured to and extending from said base, said second resilient contact member spaced from said first resilient contact member; a body; means operatively connected with the body and the contact members for providing that as a printed circuit board edge is inserted between the contact members to contact and move the body, the resilient contact members are urged and moved against the resilience thereof to bring portions thereof into contact with the respective opposite sides of the printed circuit board, wherein the means operatively connected with the body and contact members comprise first and second rollers rotatably mounted to the body, the contact members extending between the first and second rollers.

2. The apparatus of claim 1 wherein the resilient contact members define respective curved portions in turn defining respective seats in which the first and second rollers seat respectively with a printed circuit board removed from between the contact members.

3. The apparatus of claim 2 wherein the curved portions are brought into contact with the respective opposite sides of an inserted printed circuit board.

* * * * *